US007393460B2

(12) United States Patent
Hori et al.

(10) Patent No.: US 7,393,460 B2
(45) Date of Patent: Jul. 1, 2008

(54) PLASMA PROCESSING METHOD AND PLASMA PROCESSING APPARATUS

(75) Inventors: Masaru Hori, Nagoya (JP); Kazuhiro Kubota, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 36 days.

(21) Appl. No.: 11/374,124

(22) Filed: Mar. 14, 2006

(65) Prior Publication Data
US 2006/0223317 A1    Oct. 5, 2006

Related U.S. Application Data

(60) Provisional application No. 60/666,695, filed on Mar. 31, 2005.

(30) Foreign Application Priority Data
Mar. 29, 2005  (JP) ............... 2005-095969

(51) Int. Cl.
*H01L 21/302* (2006.01)
(52) U.S. Cl. .............. 216/67; 216/79; 216/69; 216/71; 438/725; 438/689
(58) Field of Classification Search ............ 216/67
See application file for complete search history.

(56) References Cited

U.S. PATENT DOCUMENTS 5,300,460 A * 4/1994 Collins et al. ............... 438/712
6,414,080 B1 * 7/2002 Loeffler et al. ............... 524/801
6,667,248 B2 * 12/2003 M'Saad et al. ............... 438/788
6,846,515 B2 * 1/2005 Vrtis et al. ............... 427/255.29
7,029,992 B2 * 4/2006 Shieh et al. ................. 438/474
2004/0152334 A1 * 8/2004 Ohto et al. .................. 438/758

FOREIGN PATENT DOCUMENTS

| JP | 7-211492 | 8/1995 |
| JP | 2000-183040 | 6/2000 |
| WO | 01/08208 | 1/2001 |

OTHER PUBLICATIONS

Nagai et al. (Measurement of Oxygen Atom Density Employing Vacuum . . . ; Rev. Sci. Instrum., vol. 74, No. 7, Jul. 2003).*
Hong et al. (Reduction of Perfluorocompound Emissions . . . Thin Solid Films, vol. 435, Is. 1-2, Jul. 1, 2003, pp. 329-334).*
Saito et al (A Process for Photoresist Removal after Al Etching . . . , J. of Electrochemical Society, vol. 149, No.*
Nagai et al (Effects of Oxygen and Nitrogen Atoms on SiOCH Film . . . ; Jpn. J. Appl. Phys. vol. 42 (2003) Pt. 2, No. 3B).*
Wolf et al. (Silicon Processing for the VLSI Era; vol. 1; 1986; Lattice Press).*

* cited by examiner

*Primary Examiner*—Nadine Norton
*Assistant Examiner*—Patricia A George
(74) *Attorney, Agent, or Firm*—Oblon, Spivak, McClelland, Maier & Neustadt, P.C.

(57) ABSTRACT

The plasma processing method comprises the step of removing an organic material film forming an upper layer relative to a patterned SiOCH series film by the processing with a plasma of a process gas containing an $O_2$ gas, wherein the plasma has an $O_2^+$ ion density not lower than $1\times10^{11}$ cm$^{-3}$ and an oxygen radical density not higher than $1\times10^{14}$ cm$^{-3}$.

22 Claims, 5 Drawing Sheets

PLASMA PROCESSING METHOD AND PLASMA PROCESSING APPARATUS

BACKGROUND OF THE INVENTION

1. Field of the Invention

The present invention relates to a plasma processing method, particularly, to a plasma processing method in which organic materials such as a photoresist film remaining on the surface of the target object to be processed after, for example, the etching process is removed by using plasma and also relates to a plasma processing apparatus used for working the plasma processing method.

2. Description of the Related Art

In various semiconductor devices, the miniaturization and multi-layered construction of the wiring structure are being promoted in accordance with the progress in the degree of integration that has been achieved in recent years. Since the miniaturization of the wiring structure tends to invite an increase in the capacitance between adjacent wirings, a low dielectric constant material (low-k material) has come to be used for forming an interlayer insulating film. In, for example, the technology known to the art as the damascene process, a wiring groove is formed by selectively etching an interlayer insulating film, followed by burying Cu having a low resistivity in the wiring groove thus formed and subsequently planarizing the interlayer insulating film by a CMP (Chemical Mechanical Polishing) treatment so as to form a wiring. A low-k material such as a SiOCH series material is used for forming the interlayer insulating film.

In the manufacturing process of a semiconductor device, an etching treatment utilizing the photolithography technology is carried out for forming a device structure. For example, in the damascene process referred to above, a photoresist film formed on the interlayer insulating film is patterned and, then, the interlayer insulating film is subjected to an etching treatment by using the patterned photoresist film as a mask so as to form a wiring groove in the interlayer insulating film. Further, the remaining photoresist film is removed by an ashing process. The ashing process can be carried out by a plasma processing using, for example, an oxygen gas plasma. However, it is known to the art that the low-k material tends to incur a so-called "plasma damage" that the low-k material is affected by the plasma in performing the ashing process, with the result that the low-k material is oxidized and denatured. For example, if the interlayer insulating film incurs the plasma damage, various problems are generated. First of all, in the subsequent washing process with a dilute hydrofluoric acid (HF), the denatured portion of the interlayer insulating film is dropped so as to bring about a change in the shape of the etched portion. An additional problem is that the film quality is lowered so as to elevate the dielectric constant. As a result, the wiring capacitance is increased, and a delay of signal is invited.

Under the circumstances, Japanese Patent Application Kokai Publication No. 2000-183040 proposes a method that a hole is formed first by etching in an organic interlayer insulating film, then, an underlying substance is allowed to be attached to the side wall of the hole by performing a reverse sputtering in order to prevent the organic interlayer insulating film from being denatured or changed in shape by the ashing treatment in the subsequent step, followed by performing a plasma processing.

Also, Japanese Patent Application Kokai Publication No. 7-211492 proposes a method of carrying out a plasma ashing treatment by using a mixed gas consisting of oxygen and a rare gas and having a pressure of 100 Torr in order to prevent the damage caused by the function of ions in the ashing stage, though the technology disclosed in this prior art is not directed to a low-k film such as a SiOCH series film.

However, in the method disclosed in Japanese Patent Application Kokai Publication No. 2000-183040 quoted above, it is necessary to employ a new additional step of the reverse sputtering process in order to suppress the plasma damage, leading to the demerit that the number of process steps is increased. In addition, the conditions themselves of the ashing treatment have not yet been studied.

In the method disclosed in Japanese Patent Application Kokai Publication No. 7-211492 quoted above, the processing is carried out under a relatively high pressure close to the ordinary pressure in order to suppress the damage done by ions. Naturally, it is impossible to apply the method disclosed in the patent document quoted above as it is to the ordinary plasma ashing process that is carried out under the state close to the state of vacuum (e.g., to the ashing process disclosed in Japanese Patent Application Kokai Publication No. 2000-183040 quoted above).

As pointed out above, the prior art was not satisfactory in the aspect that the plasma damage done to the low-k film such as a SiOCH series film is suppressed by controlling the conditions of the ashing treatment.

BRIEF SUMMARY OF THE INVENTION

An object of the present invention is to provide a plasma processing method that permits removing an organic material film efficiently while avoiding the plasma damage done to the SiOCH series film by controlling the conditions of the plasma processing.

The present inventors have found that the plasma damage done to the low-k film can be suppressed by carrying out the plasma processing under the conditions that the $O_2^+$ ions are rendered predominant within plasma so as to arrive at the present invention.

According to a first aspect of the present invention, there is provided a plasma processing method, comprising the step of removing an organic material film forming an upper layer relative to a patterned SiOCH series film by using a plasma of a process gas containing an $O_2$ gas, wherein the plasma has an $O_2^+$ ion density not lower than $1 \times 10^{11}$ cm$^{-3}$ and an oxygen radical density not higher than $1 \times 10^{14}$ cm$^{-3}$.

In the first aspect, it is desirable for the $O_2^+$ ion to have an energy of 0.5 to 7 eV.

Also, it is desirable for the process pressure to fall within a range of 75 to 125 Pa.

It is also desirable for the process gas to contain an inert gas. In this case, it is desirable for the inert gas to be selected from the group consisting of Ar, Kr and Xe. Further, it is desirable for the $O_2^+$ ion to be formed within the plasma by the charge transfer from the ion of the inert gas.

It is desirable for the plasma to be formed of a down flow plasma formed by a surface wave type plasma generating means. In this case, it is desirable for the microwave that is applied to the surface wave type plasma generating means to have a frequency falling within a range of 500 MHz to 10 GHz. Also, it is desirable for the power of the microwave per unit area to fall within a range of 2.0 to 5.0 W/cm$^2$.

According to a second aspect of the present invention, there is provided a plasma processing method, comprising the step of removing an organic material film forming an upper layer relative to a patterned SiOCH series film by the processing with a plasma of a process gas consisting of an $O_2$ gas and an inert gas, wherein the flow rate ratio of the $O_2$ gas in the process gas is not higher than 3%, the process pressure is 75 to 125 Pa, and a microwave having a frequency of 500 MHz to 10 GHz is applied to a surface wave type plasma generating means with the power per unit area of the microwave set at 2.0 to 5.0 W/cm². Incidentally, the "flow rate ratio of $O_2$ gas" noted above denotes the percentage of the $O_2$ gas flow rate based on the flow rate of the entire process gas.

According to a third aspect of the present invention, there is provided a plasma processing method, comprising the step of removing an organic material film forming an upper layer relative to a patterned SiOCH series film by the processing with a plasma of a process gas consisting of an $O_2$ gas and an inert gas by using a surface wave type plasma processing apparatus in which a microwave is introduced by using a slot antenna into a process chamber so as to permit the surface wave to be propagated, thereby generating a plasma; wherein the surface wave type plasma processing apparatus comprises a measuring section for measuring the plasma parameter of the plasma within the process chamber, and the plasma parameter is measured by the measuring section so as to carry out the plasma processing while monitoring the plasma parameter.

In the third aspect described above, it is desirable for the process conditions to be controlled based on the measured values of the plasma parameters within the plasma that are measured by the measuring section. In this case, it is desirable for the process condition to be at least one condition selected from the group consisting of the flow rate ratio of the $O_2$ gas contained in the process gas, the process pressure and the power of the microwave. Further, it is desirable for the plasma parameter to be selected from the group consisting of the oxygen radical density, the ion density and the electron density within the plasma.

Further, in each of the first to third aspects described above, it is possible for an intermediate layer to be formed between the SiOCH series film and the organic material film.

According to a fourth aspect of the present invention, there is provided a control program that, when executed, works a computer to control a plasma processing apparatus using a plasma processing method, the method comprising the step of removing an organic material film forming an upper layer relative to a patterned SiOCH series film by using a plasma of a process gas containing an $O_2$ gas, wherein the plasma has an $O_2^+$ ion density not lower than $1\times10^{11}$ cm$^{-3}$ and an oxygen radical density not higher than $1\times10^{14}$ cm$^{-3}$.

According to a fifth aspect of the present invention, there is provided a computer readable storage medium containing a software that, when executed, works a computer to control a plasma processing apparatus using a plasma processing method, the method comprising the step of removing an organic material film forming an upper layer relative to a patterned SiOCH series film by using a plasma of a process gas containing an $O_2$ gas, wherein the plasma has an $O_2^+$ ion density not lower than $1\times10^{11}$ cm$^{-3}$ and an oxygen radical density not higher than $1\times10^{14}$ cm$^{-3}$.

According to a sixth aspect of the present invention, there is provided a plasma processing apparatus in which a microwave is introduced by a slot antenna into a process chamber so as to propagate a surface wave, thereby generating a plasma, the apparatus comprising:

a control section for controlling the plasma processing apparatus so as to carry out within the process chamber a plasma processing method comprising the step of removing an organic material film forming an upper layer relative to a patterned SiOCH series film by using a plasma of a process gas containing an $O_2$ gas, wherein the plasma has an $O_2^+$ ion density not lower than $1\times10^{11}$ cm$^{-3}$ and an oxygen radical density not higher than $1\times10^{14}$ cm$^{-3}$.

In the present invention, a plasma processing is applied to an organic material film forming an upper layer relative to a patterned SiOCH series film by using a plasma having an $O_2^+$ ion density not lower than $1\times10^{11}$ cm$^{-3}$ and an oxygen radical density not higher than $1\times10^{14}$ cm$^{-3}$ so as to remove (by ashing or etching) the organic material film such as a resist film with a high rate while suppressing the plasma damage done to the SiOCH series film.

In the present invention, attentions are paid to prescribed ion species present within the plasma and the plasma damage is lowered by positively utilizing the function of the particular ion species. In short, the present invention is based on a mechanism exactly opposite to that disclosed in Japanese Patent Application Kokai Publication No. 7-211492 quoted previously. According to the present invention, it is possible to carry out a plasma processing free from damages done to the SiOCH series interlayer insulating film and to the underlying film.

DETAILED DESCRIPTION OF THE INVENTION

Some embodiments of the present invention will now be described in detail with reference to the accompanying drawings.

Figure 1:
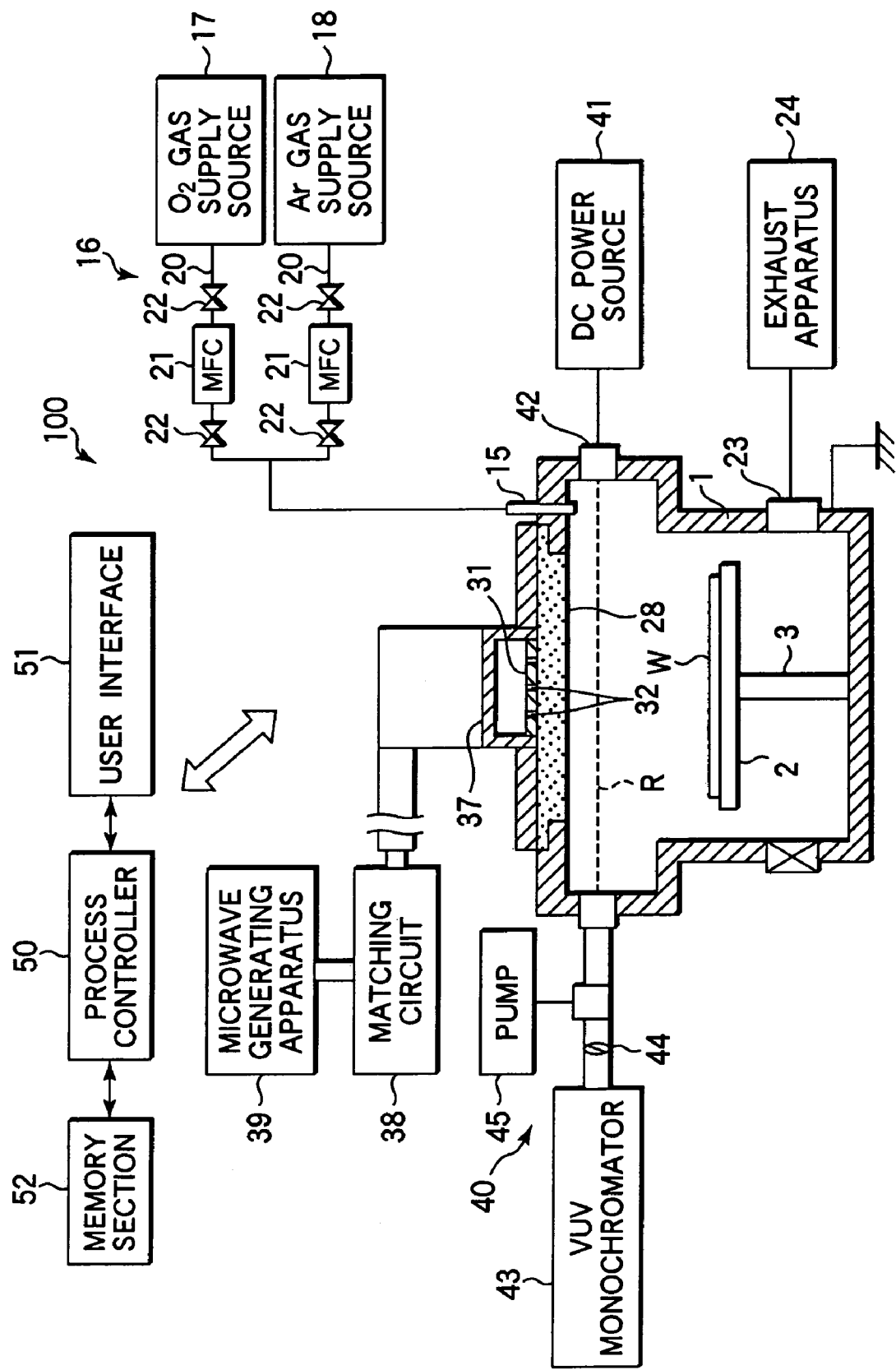
FIG. 1 is a cross sectional view schematically showing the construction of a plasma processing apparatus.

FIG. 1 is a cross sectional view schematically exemplifying the construction of a plasma processing apparatus 100 adapted for use for carrying out the plasma processing method of the present invention. The plasma processing apparatus shown in the drawing is constructed as a surface wave plasma processing apparatus in which a microwave is introduced by a slot antenna into a process chamber so as to generate surface wave plasma. In the plasma processing apparatus 100, the process gas is converted into a plasma by the surface wave in the vicinity of a microwave introducing window 28 formed of, for example, quartz so as to generate efficiently a down flow plasma. Therefore, the plasma processing apparatus 100 can be suitably utilized in, for example, the ashing treatment after the etching treatment applied to, for example, an interlayer insulating film having a low dielectric constant.

The plasma processing apparatus 100 comprises a substantially cylindrical chamber 1 that is hermetically closed and is connected to the ground. Arranged within the chamber 1 is a susceptor 2 formed of a ceramic material such as AlN and serving to hold a semiconductor wafer W (hereinafter referred to simply as "wafer W") used as a target object to be processed. The wafer W is held horizontal by the susceptor 2 within the chamber 1. The susceptor 2 is supported by a cylindrical support member 3 formed of a ceramic material such as AlN and extending upward from the center in the bottom portion of the chamber 1. Also, a resistance heating type heater (not shown) is buried in the susceptor 2. The susceptor 2 is heated by supplying an electric power to the heater so as to heat the wafer W used as a target substrate to a prescribed temperature.

The upper portion of the chamber 1 is open, and a microwave introducing window 28, which is formed of a ceramic material such as quartz, AlN, or $Al_2O_3$ and which permits transmitting the microwave, is arranged to close hermetically the upper open portion of the chamber 1. It follows that the inner region of the chamber 1 is held hermetic.

A waveguide 37 is connected to the center of the microwave introducing window 28. The waveguide 37 extends in a direction perpendicular to the paper and is provided with a slot antenna 31 having a plurality of slots 32 in the vicinity of the edge portion above the microwave introducing window 28. The plural slots 32 extend through the slot antenna 31.

The waveguide 37 is bent at an optional point, and a microwave generating apparatus 39 is connected to the end of the waveguide 37 via a matching circuit 38. Because of the particular construction, a microwave having a frequency of, for example, 2.45 GHz, which is generated from the microwave generating apparatus 39, is transmitted to the slot antenna 31 via the waveguide 37.

A gas introducing member 15 is arranged in an upper portion of the chamber 1, and a gas supply system 16 is connected to the gas introducing member 15. The gas supply system 16 includes, for example, an $O_2$ gas supply source 17 and an Ar gas supply source 18. These gases flow through gas lines 20 so as to reach the gas introducing member 15 and, then, are introduced into the chamber 1 from the gas introducing member 15. A mass flow controller 21 and opening-closing valves 22 are mounted to each of the gas lines 20. The opening-closing valves 22 are mounted to have the mass flow controller 21 sandwiched therebetween. Incidentally, it is possible to use as a process gas an inert gas like a rare gas such as a Kr gas or a Xe gas in place of the Ar gas.

An exhaust port 23 is formed in the side wall of the chamber 1. An exhaust apparatus 24 including a high speed vacuum pump is connected to the exhaust port 23. The gas within the chamber 1 is exhausted through the exhaust port 23 by operating the exhaust apparatus 24. As a result, it is possible to lower the inner pressure of the chamber 1 to a prescribed degree of vacuum, e.g., to 0.133 Pa, at a high speed.

The plasma processing apparatus 100 comprises a measuring section 40 used as a means for measuring the plasma parameters. For example, the measuring section 40 is capable of optically measuring the density of the oxygen radicals (oxygen atom; O*) providing one of the plasma parameters by utilizing the vacuum ultra violet absorption spectroscopy. In this method, a plasma is irradiated with an atomic emission to be measured so as to measure the intensity of the atomic emission when the atomic emission passes through the plasma and to measure the intensity of the atomic emission when the atomic emission is not absorbed. It is possible to determine directly the oxygen radical density based on the ratio of the intensities of the atomic emission noted above. Since this method is a non-contact measuring method utilizing light, the oxygen radical density can be measured by the in-line system without affecting the plasma to be measured.

The measuring section 40 comprises a light source 42 such as a hollow cathode lamp connected to a DC power source 41 and a VUV monochromator 43 arranged outside the chamber 1 on the opposite side. As shown in the drawing, the light source 42 and the VUV monochromator 43 acting as a light-receiving section are arranged such that the plasma space of the chamber 1 is sandwiched between the light source 42 and the VUV monochromator 43. Incidentally, a $MgF_2$ lens 44 for collecting the light emitted from the light source 42 and a pump 45 are arranged in front of the VUV monochromator 43 as viewed from the chamber 1. The VUV monochromator 43 is connected to a process controller 50 (described herein later) equipped with a computer. The measured data are processed and the process conditions are controlled in the process controller 50. In the case of measuring the surface wave plasma by using the measuring section 40, the measuring position i.e., the optical path R along which passes the atomic emission from the light source 42 toward the VUV monochromator 43, can be set, for example, 3 cm below the lower surface of the microwave transmitting window 28.

Each constituent of the plasma processing apparatus 100 is connected to the process controller 50 equipped with a CPU so as to be controlled by the process controller 50. Connected to the process controller 50 is a keyboard that is operated by a process supervisor for inputting commands for supervising the plasma processing apparatus 100. Also connected to the process controller 50 is a user interface 51 including, for example, a display for visually indicating the operating state of the plasma processing apparatus 100.

Further, a memory section 52 storing a recipe is connected to the process controller 50. Recorded in the recipe are the control program (soft ware) for realizing various treatments carried out by the plasma processing apparatus 100 under the control by the process controller 50 and the process condition data.

An optional recipe is read from the memory section 52 in response to, for example, an instruction given from the user interface 51, and the process controller 50 is allowed to execute the recipe, thereby allowing the plasma processing apparatus 100 to perform a desired processing under the control by the process controller 50. Also, it is possible to utilize the control program and the recipe such as the process condition data, which are stored in a memory medium that can be read by a computer such as a CD-ROM, a hard disc, a flexible disc or a flash memory. It is also possible to utilize the control program and the recipe on the on-line basis by allowing the control program and the recipe to be transmitted from another apparatus via, for example, a lease line.

In the plasma processing apparatus 100 of the construction described above, the microwave having a frequency of, for example, 2.45 GHz, which is oscillated from the microwave generating apparatus 39, is propagated inside the waveguide 37 via the matching circuit 38. The microwave passes through the slots 32 of the slot antenna 31 so as to be incident on the microwave introducing window 28 and, then, expands downward in the form of a surface wave along the lower surface of the microwave introducing window 28, thereby forming a propagating region substantially equal to the area of the microwave introducing window 28. Since the energy of the surface wave excites the process gas introduced into the chamber 1 so as to form a surface wave-excited plasma, an ashing treatment can be applied to the wafer W by utilizing the surface wave-excited plasma.

Figure 2A:
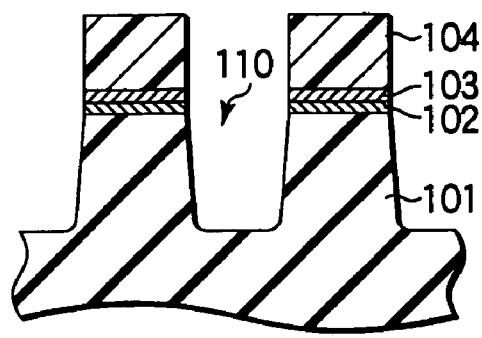
FIG. 2A is a cross sectional view schematically showing the construction of a gist portion of a wafer after the etching step.
Figure 2B:
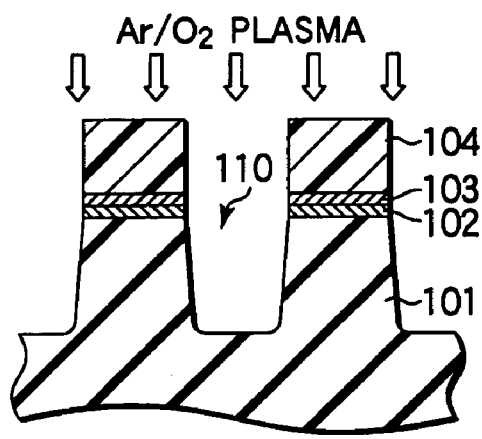
FIG. 2B is a cross sectional view schematically showing the construction of a gist portion of a wafer during the ashing treatment.
Figure 2C:
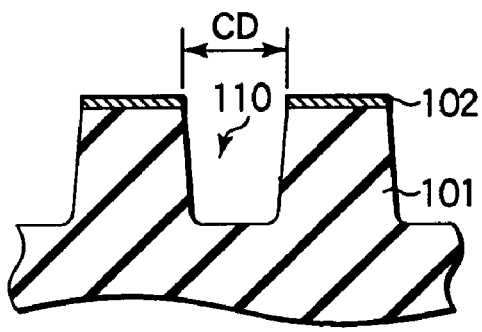
FIG. 2C is a cross sectional view schematically showing the construction of a gist portion of a wafer after the ashing treatment.

FIGS. 2A to 2C are intended to explain the plasma ashing method, which is one of the applications of the plasma processing method of the present invention, and show schematically the cross sections of a gist portion of the wafer W. FIG. 2A shows the state after the etching treatment. As shown in the drawing, an interlayer insulating film 101 formed of a low-k material having a dielectric constant not larger than, for example, 3.0 is formed on the wafer W. A hard mask 102 made of, for example, $SiO_2$, SiC, or SiCN is formed as an intermediate layer on the interlayer insulating film 101. Further, an antireflection film 103 is formed on the hard mask 102. The interlayer insulating film 101 formed of a low-k material is formed in the form of a SiOCH series film containing Si, O, C and H as main constituting elements. The SiOCH series film noted above includes, for example, MSQ (methyl silsesquioxane), a porous MSQ having a porous structure, CORAL (trade name, manufactured by Novellus Systems Inc.), Black Diamond (trade name, manufactured by Applied Materials Inc.), and Aurora (trade name, manufactured by ASM Inc.).

A resist film 104, which is an organic material film patterned by the photolithography technology and used as a mask in the etching step, remains on the antireflection film 103. Incidentally, a reference numeral 110 denotes an etching groove formed by the etching treatment.

FIG. 2B shows the state that a plasma ashing treatment is being conducted for removing the resist film 104. The plasma ashing treatment is carried out by using $O_2$ and a rare gas such as Ar or Kr as the process gas in the plasma processing apparatus 100 constructed substantially as shown in FIG. 1.

To be more specific, a microwave oscillated from the microwave generating apparatus 39 is introduced onto the microwave introducing window 28 via the waveguide 37 and the slot antenna 31 under the state that the process gas is introduced into the chamber 1. A surface wave is formed within the chamber 1 by the microwave introduced onto the microwave introducing window 28, and the resist film 104 is subjected to the ashing treatment by utilizing the plasma excited by the surface wave.

In this case, the plasma processing is carried out under the conditions that the plasma has an $O_2^+$ ion density of $1 \times 10^{11}$ $cm^{-3}$ or more, preferably within a range of $1 \times 10^{11}$ $cm^{-3}$ to $5 \times 10^{12}$ $cm^{-3}$ and an oxygen radical density not higher than $1 \times 10^{14}$ $cm^{-3}$, preferably within a range of $1 \times 10^{13}$ $cm^{-3}$ to $1 \times 10^{14}$ $cm^{-3}$. In this case, it is desirable to perform the plasma processing under the condition that the ratio of the $O_2^+$ ion density to the oxygen radical density ($O_2^+$ ion density/oxygen radical density) falls within a range of 0.01 to 0.2.

The $O_2^+$ ion density and the oxygen radical density can be controlled appropriately by controlling the flow rate ratio of the process gas as described herein later.

Also, it is possible to control independently the $O_2^+$ ion density and the oxygen radical density by changing, for example, the distance (gap) between the plasma source and the wafer W. Since the $O_2^+$ ion has a life shorter than that of the oxygen radical, it suffices to diminish the gap between the plasma source and the wafer W for increasing, for example, the amount of the $O_2^+$ ions incident on the substrate. It should be noted, however, that the gap has an appropriate distance. It is desirable for the optimum gap, which can be determined experimentally, to be set at, for example, about 30 to 200 mm.

Another method of controlling independently the $O_2^+$ ion density and the oxygen radical density is to control the pressure. The threshold value (about 8 eV) of the electron energy required for the formation of the oxygen radical from the oxygen molecule differs from the threshold value of the electron energy required for the ion formation ($Kr^+$, $O_2^+$: not lower than 10 eV). Therefore, if the pressure is changed, the electron temperature of the plasma is also changed so as to change the ratio of the amount of the formed ions and to the amount of the formed radicals. For example, if the pressure is increased, the electron temperature is lowered so as to cause the decrease in the formed amount of the radicals to be larger than the decrease in the formed amount of the ions. It follows that it is possible to change the ratio of the $O_2^+$ ion density to the oxygen radical density by changing the pressure.

As described above, the electron temperature of the plasma provides a parameter contributing to the formation of the $O_2^+$ ions and the oxygen radicals in the plasma. Table 1 shows the relationship among the electron temperature and the forming rates of Ar ions and oxygen radicals within the plasma. Comparison between the Ar ions and the oxygen radicals is taken up in the Table 1 because the formation of the $O_2^+$ ion is considered to be brought about by the charge transfer between the rare gas ion and the oxygen molecule.

TABLE 1

| Electron Temperature [ev] | Forming rate of $Ar^+$ [$m^3$/s] (A) | Forming rate of O* [$m^3$/s] (B) | Ratio (B/A) |
|---|---|---|---|
| 1 | $2.26 \times 10^{-21}$ | $8.00 \times 10^{-22}$ | 0.35 |
| 2 | $1.21 \times 10^{-17}$ | $5.55 \times 10^{-18}$ | 0.45 |
| 3 | $2.24 \times 10^{-16}$ | $1.20 \times 10^{-16}$ | 0.53 |
| 4 | $1.02 \times 10^{-15}$ | $5.99 \times 10^{-16}$ | 0.58 |

As apparent from Table 1, the forming rate of the oxygen radicals is increased with increase in the electron temperature. This clearly supports that the electron temperature should desirably be low in order to suppress the formation of the oxygen radicals and to increase the formation of the $O_2^+$ ions. The plasma processing apparatus 100 shown in FIG. 1, which is of the surface wave plasma type, is featured in that it is possible to form a plasma having a low electron temperature, compared with the plasma processing apparatus of another type (e.g., a parallel plate type). It is considered reasonable to understand that the surface wave plasma system has an electron energy density of a double distribution under a high pressure, i.e., the distribution of the electron energy in which electrons having an electron temperature contributing to the formation of the oxygen radicals are contained in a small amount and the electrons having an electron temperature contributing to the formation of oxygen ions are contained in a large amount, thereby suppressing the formation of the oxygen radicals to a low level and efficiently increasing the formation of the $O_2^+$ ions.

Also, the behavior of the oxygen radical is changed by the covering rate of the resist. Therefore, the oxygen radicals are consumed in a larger amount than the oxygen ions, if the decomposition products, which are obtained by the decomposition of the resist such as $CH_4$, CO, $CO_2$, $C_xH_yO_z$ (where x, y, z denote an optional number that can be taken stoichiometrically), and $H_2$ are added to the process gas. It follows that it is possible to control the amounts of the oxygen radicals and the oxygen ions.

In order to maintain a sufficient ashing rate, it is desirable for the energy of the $O_2^+$ ion in the plasma processing to fall within a range of 0.5 to 7 eV, more desirably to be not lower than 3.6 eV, which is the coupling energy of the carbon-to-carbon bond (C—C bond). In other words, it is more desirable for the energy of the $O_2^+$ ion to fall within a range of 3.6 to 7 eV.

In order to generate the plasma having the characteristics described above, it is desirable for the flow rate ratio of the $O_2$ gas contained in the process gas to be not higher than 3%, preferably not higher than 1%. It follows that the flow rate ratio of the $O_2$ gas contained in the process gas can be set to fall within a range of, for example, 0.1 to 3% (preferably 0.1 to 1%).

It is desirable for the process pressure in the chamber 1 to be 75 to 125 Pa, more desirably 85 to 95 Pa. If the process pressure is lower than 75 Pa, the charge transfer of "rare gas ion+$O_2$→rare gas+$O_2^+$" is unlikely to take place. On the other hand, if the process pressure is higher than 125 Pa, the formed plasma tends to be made nonuniform.

It is desirable for the microwave to have a frequency of 500 MHz to 10 GHz, more desirably. 900 MHz to 2.45 GHz. If the frequency of the microwave falls within the range given above, it is possible to obtain the effect of obtaining a high density plasma having a low electron temperature with a high uniformity.

It is desirable for the microwave power per unit area to be 2.0 to 5.0 W/cm², more desirably 2.3 to 3 W/cm². The expression "microwave power per unit area" used herein denotes the value obtained by dividing the power of the microwave by the area of the microwave introducing window 28 (having a diameter of 220 mm). If the microwave power per unit area falls within the range given above, the electron density is increased so as to make it possible to obtain sufficiently the ionization effect of the oxygen gas produced by the charge transfer from the inert gas ion.

It should also be noted that, by carrying out the ashing treatment while monitoring the behavior of the oxygen radical within the plasma by using the measuring section 40, it is possible to carry out the plasma processing under the optimum conditions so as to make it possible to carry out the ashing treatment while suppressing the plasma damage.

To be more specific, since the oxygen radicals within the plasma can be decreased under the conditions of a high rare gas flow rate and a low oxygen gas flow rate as supported by an experimental data described herein later, the behavior of the $O_2^+$ ion can be detected indirectly by monitoring the oxygen radical density during the ashing treatment, if the relationship between the measured value of the oxygen radical density and the value of the $O_2^+$ ion density within the plasma is obtained in advance. It follows that the ashing treatment can be performed under the optimum condition by correcting the process condition as required or by stopping the ashing treatment depending on the situation based on the measured value of the oxygen radical density. The process condition in this case can be selected from, for example, the flow rate ratio of the $O_2$ gas contained in the process gas, the process pressure, the power of the microwave, and the total flow rate of the process gas. It is also possible to combine a plurality of these conditions.

Incidentally, it is possible to measure directly the $O_2^+$ ion density and to monitor the measured value or to measure the electron density and to monitor the measured value. In this case, these measured values are monitored as plasma parameters other than the oxygen radical density.

By the plasma ashing treatment described above, the resist film 104 and the antireflection film 103 are removed as shown in FIG. 2C. In the present invention, it is possible to carry out the ashing treatment that permits suppressing the plasma damage such as denaturation that is done to the interlayer insulating film 101 by carrying out the ashing treatment under the conditions given above by using the plasma processing apparatus shown in FIG. 1. After the ashing treatment, washing is performed by using a chemical solution such as a dilute hydrofluoric acid (HF). It is possible to detect the presence of a plasma damage by measuring CD (critical dimension) of the etching groove 110 before and after the washing treatment. If a plasma damage is not done, the critical dimension CD is scarcely changed so as to substantially maintain the etching shape shown in FIG. 2A. If a plasma damage is done to the interlayer insulating film 101, however, the denatured portion of the interlayer insulating film 101 is etched with HF so as to cause dropping or loss on, for example, the surface of the side wall portion of the interlayer insulating film 101, thereby changing the critical dimension CD. Such a change in the critical dimension CD leads to deterioration of the characteristics of the semiconductor device.

Figure 3:
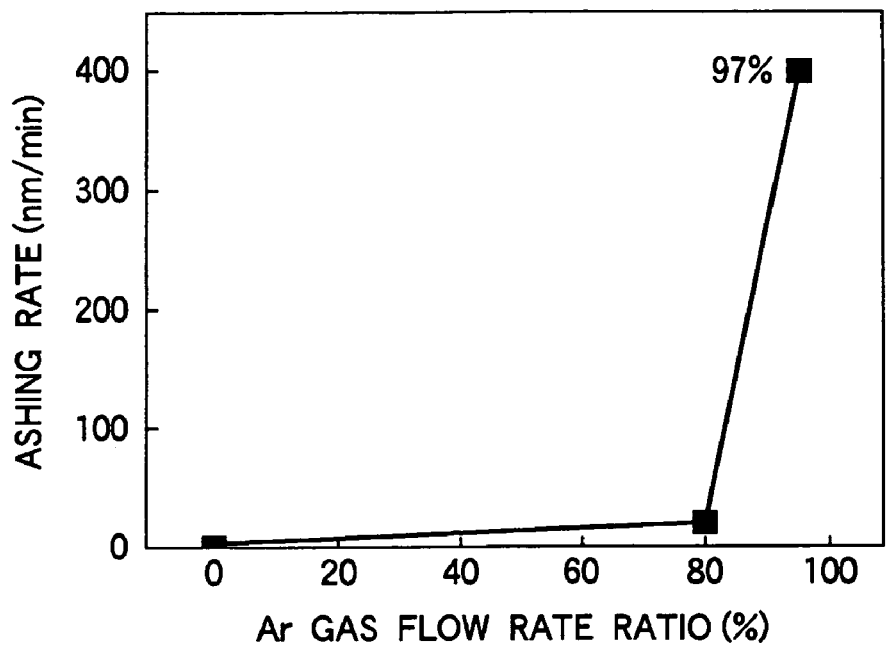
FIG. 3 is a graph showing the relationship between the flow rate ratio of an ashing gas and the ashing rate.

The experimental data providing the basis of the present invention will now be described with reference to FIGS. 3 to 5. FIG. 3 is a graph showing the change in the ashing rate, covering the case where a plasma processing was applied to the surface of the wafer W having an etched shape and constructed as shown in FIG. 2A by the procedures similar to those described above in conjunction with FIGS. 2A to 2C so as to subject the resist film 104 to an ashing treatment. In this experiment, the conditions of the plasma ashing treatment were set such that the process gas consisting of an Ar gas and an $O_2$ gas was supplied into the chamber 1 in a total flow rate of 100 mL/min (sccm), and that the flow rate ratio of the Ar gas, i.e., percentage of the Ar gas flow rate based on the flow rate of the entire process gas, was set at 0%, 80% or 97%. The power of the microwave (continuous wave) was set at 1,000 W, the process pressure was set at 90 Pa, the process temperature (temperature of wafer W) was set at 20° C., and the distance (gap) between the lower edge of the microwave transmitting window 28 and the wafer W was set at 50 mm.

As shown in FIG. 3, the ashing rate was very low, i.e., about 20 nm/min., in the cases where the flow rate ratio of the Ar gas contained in the process gas was set at 0% ($O_2$ flow rate ratio of 100%) and at 80% ($O_2$ flow rate ratio of 20%). However, the ashing rate was prominently increased to reach about 400 nm/mm in the case where the flow rate ratio of the Ar gas was increased to 97% ($O_2$ flow rate ratio of 3%). The experimental data clearly support that, in order to obtain a high ashing rate, it is desirable to increase the diluting rate of the process gas with a rare gas and to set the flow rate ratio of the $O_2$ gas contained in the process gas at a low level.

Figure 4:
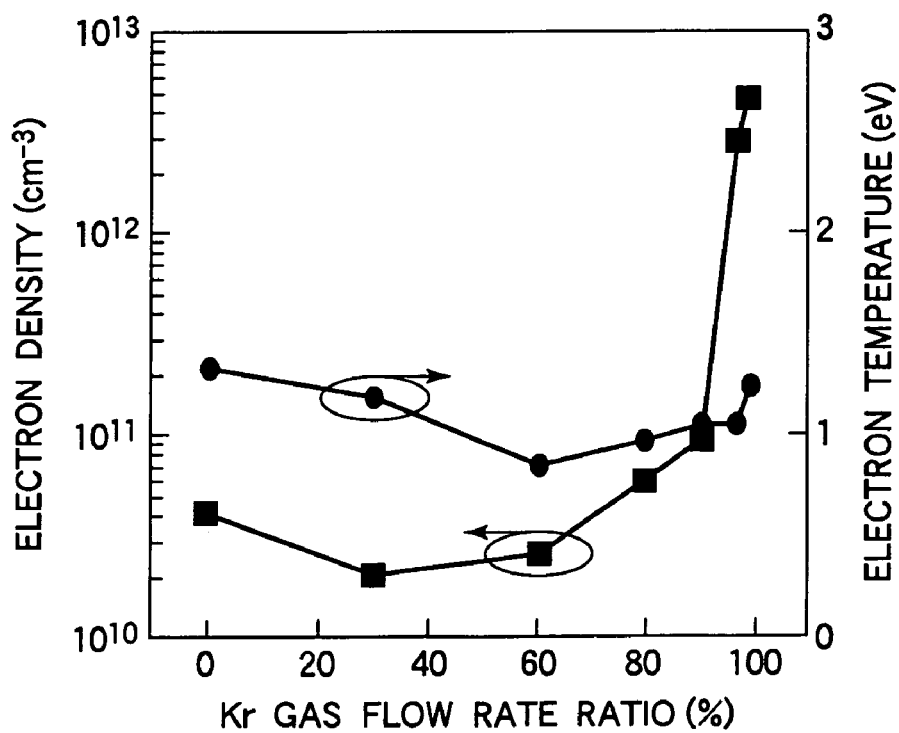
FIG. 4 is a graph showing the relationship among the flow rate ratio of the ashing gas, the electron temperature and the electron density.

FIG. 4 is a graph showing the electron temperature and the electron density in a plasma which were measured by a single probe method, covering the case where the plasma was formed tentatively in the plasma processing apparatus 100 shown in FIG. 1 by using a mixed gas of Kr and $O_2$ as the process gas. In this test, the plasma-forming conditions were changed such that Kr and $O_2$ forming the process gas were introduced into the chamber 1 in a total flow rate of 100 mL/min (sccm) and that the flow rate ratio of the Kr gas, i.e., the percentage of the Kr gas flow rate based on the flow rate of the entire process gas, was changed to 0%, 30%, 60%, 80%, 90%, 97% or 99%. Incidentally, the power of the microwave (continuous wave) was set at 1,000 W, the process pressure was set at 90 Pa, the process temperature (temperature of the wafer W) was set at 20° C., and the distance (gap) between the lower edge of the microwave transmitting window 28 and the wafer W was set at 50 mm.

Circular dots plotted in FIG. 4 denote the electron temperature, and the square dots denote the electron density. As apparent from FIG. 4, the electron temperature of the plasma was maintained substantially constant regardless of the Kr gas flow rate ratio. However, the electron density was rapidly increased at the time when the flow rate ratio of the Kr gas exceeded about 90%. As known to the art, the electron density in a plasma is exhibited as a value substantially comparable to the ion density and, thus, it is considered reasonable to understand that the amount of ions was rapidly increased in the case where the gas flow rate ratio of the Kr gas exceeded 90% ($O_2$ flow rate ratio lower than 10%).

Figure 5:
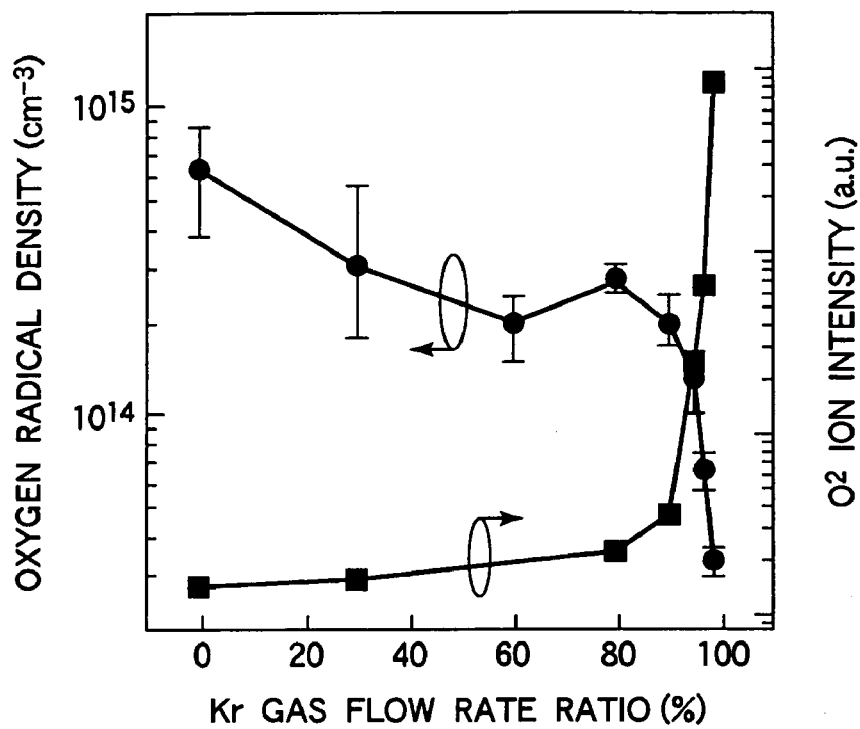
FIG. 5 is a graph showing the relationship among the flow rate ratio of the ashing gas, the $O_2^+$ ion intensity and the oxygen radical density.

On the other hand, FIG. 5 is a graph showing the intensity of the $O_2^+$ ion and the density of the oxygen radical in a plasma, covering the case where the plasma was formed in the plasma processing apparatus shown in FIG. 1 by using a mixed gas consisting of Kr and $O_2$ as a process gas as in the test relating to FIG. 4. Incidentally, the oxygen radical in the plasma was measured on the in-line basis by using the VUV monochromator 43 included in the measuring section 40, and the intensity of the $O_2^+$ ion was measured by a Quadrupole Mass Spectrometer (QMS). In this experiment, the flow rate ratio of the Kr gas was changed to 0%, 30%, 60%, 80%, 90%, 95%, 97% or 99%. The other conditions were equal to those for the test relating to FIG. 4.

The circular dots shown in FIG. 5 denote the oxygen radical density, and the square dots denote the intensity (standard value) of the $O_2^+$ ion. Incidentally, the intensity of the $O_2^+$ ion shown in FIG. 5 does not denote directly the $O_2^+$ ion density. However, it is possible to estimate the $O_2^+$ ion density in view of the data on the electron density shown in FIG. 4.

As apparent from FIG. 5, the intensity of the $O_2^+$ ion is rapidly increased if the flow rate ratio of the Kr gas is increased to exceed 90%. On the other hand, the oxygen radical density is decreased in inverse proportion to the increase in the intensity of the $O_2^+$ ion. It should be noted in particular that it was possible to obtain a high $O_2^+$ ion intensity when the flow rate ratio of the Kr gas was not lower than 97% ($O_2$ gas flow rate ratio not higher than 3%). The value of the $O_2^+$ ion intensity in the region having the Kr gas flow rate ratio not lower than 97% corresponds to, for example, the $O_2^+$ ion density not lower than $1 \times 10^{11}$ cm$^{-3}$ (estimated value), which can be estimated in view of FIG. 4. On the other hand, the oxygen radical causing the plasma damage is lowered to a level free from a problem in view of the aspect of suppressing the plasma damage, e.g., is lowered to $1 \times 10^{14}$ cm$^{-3}$.

Concerning the other ion species, $O^+$ was lower than the limit of detection and $Kr^+$ was not detected either in the QMS measurement. Such being the situation, it has been clarified that the $O_2^+$ was predominant among the ions contained in the plasma.

Figure 6:
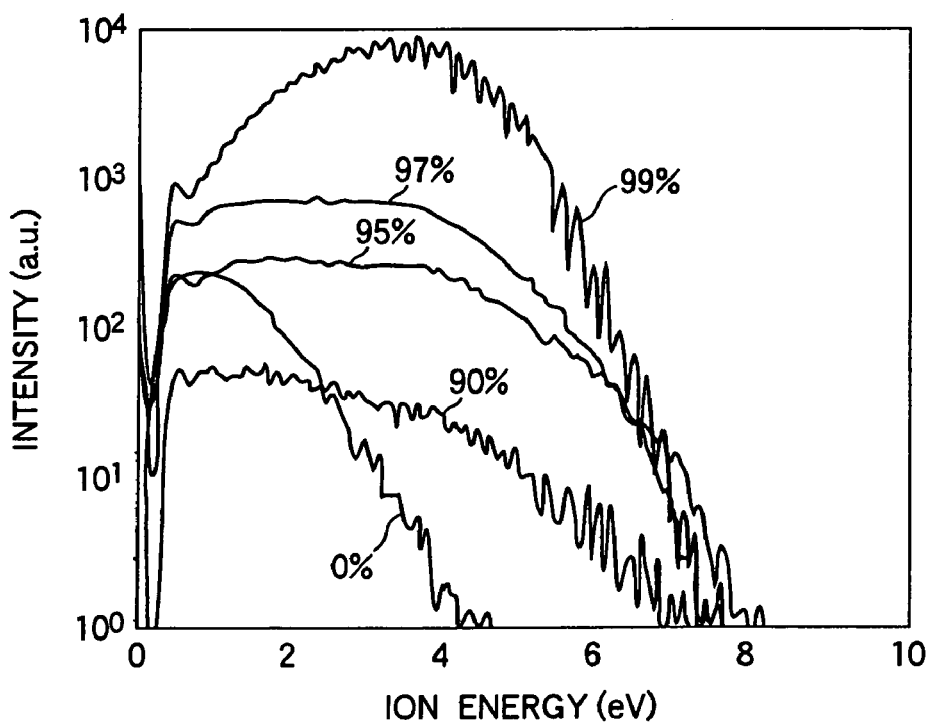
FIG. 6 is a graph showing the result of the measurement of the ion energy distribution.

Further, FIG. 6 is a graph showing the result of the measurement of the energy distribution of the $O_2^+$ ions in the test relating to FIG. 5. In the graph of FIG. 6, the ion energy intensity (standard value) is plotted on the ordinate. The percent indication given to each curve in FIG. 6 denotes the flow rate ratio of the Kr gas.

The graph of FIG. 6 indicates that the ion energy of $O_2^+$ has a peak within a range of about 0.5 to 7 eV, and that the peak of the ion energy is increased with increase in the flow rate ratio of Kr (or with decrease in the flow rate ratio of $O_2$) so as to make it possible to obtain a large incident velocity of the ion. A sufficient ashing rate can be maintained by using a plasma in which the $O_2^+$ ions having an ion energy of 0.5 to 7 eV are predominant as pointed out above.

The experimental data given in FIGS. 3 to 6 collectively suggest that the $O_2^+$ ions constitute mainly the active species in the plasma contributing to the ashing rate. The $O_2^+$ ions are rapidly increased if the $O_2$ flow rate ratio is made lower than 10% and are present in the plasma in such a large amount as to achieve a sufficient ashing rate if the flow rate ratio of $O_2$ is made lower than 3%. It is considered reasonable to understand that the $O_2^+$ ions are formed when the rare gas ions such as $Ar^+$ and $Kr^+$ within the plasma act on the molecular oxygen so as to bring about a charge transfer.

The $O_2^+$ ion has strong anisotropic properties. On the other hand, the oxygen radical has strong isotropic properties. Therefore, if the $O_2^+$ ions are rendered predominant within the plasma, compared with the oxygen radical, the ashing rate of the resist film 104 is increased. Also, it is considered reasonable to understand that the denaturation of the side surface of the etching groove 110 can be suppressed so as to make it possible to achieve the ashing treatment that permits suppressing the plasma damage.

Also, it has been confirmed by the behavior of the $O_2^+$ ion and the oxygen radical shown in FIG. 5 that the presence of the $O_2^+$ ion can be grasped indirectly by measuring the oxygen radical on the in-line basis by the measuring section 40 equipped with the VUV monochromator 43. It follows that it is possible to correct the process conditions for the ashing treatment during the ashing treatment or to stop the ashing treatment depending on the situation by measuring the oxygen radical and based on the measured value. In this fashion, it is possible to carry out the ashing treatment under the optimum conditions while suppressing the plasma damage.

The present invention will now be described more in detail with reference to an Example of the present invention. Needless to say, the technical scope of the present invention is not restricted by the following Example.

EXAMPLE

A plasma processing was applied to a wafer W (diameter of 200 mm) after the etching treatment, which was constructed as shown in FIG. 2A, by using a plasma processing apparatus constructed as shown in FIG. 1. The plasma processing was carried out by the procedure shown in FIGS. 2A to 2C so as to subject the resist film 104 to the ashing treatment. In this test, the plasma ashing treatment was carried out under the conditions that an Ar gas and an $O_2$ gas were introduced into the chamber 1 at a total flow rate of 100 mL/min (sccm) and that the flow rate ratio of the Ar gas was set at 97%. The power of the microwave (continuous wave) was set at 1,000 W (i.e., the power per unit area of 2.63 W/cm$^2$), the process pressure was set at 90 Pa, the process temperature (temperature of the wafer W) was set at 20° C., and the distance (gap) between the lower edge of the microwave introducing window 28 and the wafer W was set at 50 mm. The ashing treatment was performed for one minute. Incidentally, the power density, i.e., the power of the microwave per unit area noted above denotes the value of the power of the microwave divided by the area of the microwave introducing window 28.

After the ashing treatment, the width (CD) of the etching groove 110 was measured at three points of the upper portion, the middle portion and the lower portion based on the transmission electron micrograph. Then, an washing treatment was carried out by using a 0.5% dilute hydrofluoric acid (HF), followed by measuring again the value of the width CD and comparing the value of the width CD thus measured with the value of the width CD before the washing. The amounts of change of the width CD ($\Delta$CD) in the top portion, the middle portion and the lower portion were found to be 0, 3 and 0 nm, respectively.

COMPARATIVE EXAMPLE

For comparison, a plasma processing was applied to a wafer W after the etching, which was constructed as shown in FIG. 2A, by the procedures similar to those described previously in conjunction with FIGS. 2A to 2C by using a parallel plate type plasma processing apparatus so as to subject the resist film 104 to the ashing treatment. In this test, Ar and $O_2$ were introduced into the chamber 1 at a total flow rate of 1,000 mL/min (sccm), and the Ar flow rate ratio was set at 97% (or $O_2$ flow rate ratio of 3%). An RF power of 1,000 W was applied to the upper electrode, an RF power of 0 W was applied to the lower electrode, the process pressure was set at 93 Pa (or 700 mTorr), the process temperature, i.e., the temperatures of the upper electrode, the chamber wall and the lower electrode were set at 60° C., 50° C. and 40° C., respectively, and the distance (gap) between the upper and lower electrodes was set at 50 mm. Also, the processing time was set to permit the resist film having a thickness of 325 nm, which was formed on a solid wafer, to be subjected to the ashing.

After the ashing treatment, the width (CD) in the top portion of the etching groove 110 was measured. Then, a washing treatment was carried out by using a 0.5% dilute hydrofluoric acid (HF), followed by measuring again the width (CD) and comparing the width (CD) thus measured with the width (CD) before the washing. The amount of change (ΔCD) of the width (CD) in the top portion was found to be 20 nm, supporting that the plasma damage was large. Also, the ashing rate was measured and found to be not higher than 100 nm/min, which was clearly lower than that the ashing rate shown in FIG. 3 in the case of the ashing treatment performed under the same gas flow rate ratio by using the surface wave type plasma processing apparatus 100 shown in FIG. 1. In addition, the nonuniformity of the ashing rate was large on the plane of the wafer W. In other words, a large difference in the ashing rate was observed between the central portion and the edge portion of the wafer W. It is considered reasonable to understand that, in the case of using the parallel plate type plasma processing apparatus, the electron temperature of the generated plasma was high, compared with the case of using the surface wave type plasma processing apparatus 100 shown in FIG. 1, with the result that it was impossible to form a plasma having a high $O_2^+$ ion density in the case of using the parallel plate type plasma processing apparatus, leading to the difficulties pointed out above.

As apparent from the Example and the Comparative Example given above, an ashing treatment that achieves a high ashing rate can be performed while suppressing the plasma damage by carrying out the ashing treatment by using the surface wave type plasma processing apparatus 100 shown in FIG. 1 with the $O_2$ flow rate ratio set at 3% or less, thereby obtaining excellent ashing characteristics that cannot be obtained by the similar processing in the case of using the parallel plate type plasma processing apparatus.

It should be noted that the embodiment described above is simply intended to clarify the technical idea of the present invention. Naturally, the technical scope of the present invention should not be construed solely on the basis of the specific embodiment described above. In other words, the present invention can be worked in variously modified fashions on the basis of the spirit of the present invention and within the scope defined in the accompanying claims.

For example, in FIG. 1, the oxygen radical is measured by the vacuum ultraviolet absorption spectroscopy (VUVAS method) using a micro hollow cathode lamp providing a radiation light source. However, it is also possible to measure the oxygen radical by utilizing an absorption spectroscopy by a vacuum ultraviolet laser using a wavelength variable vacuum ultraviolet laser light. Also, in the case of the absorption spectroscopy noted above, it is also possible to employ a laser-induced fluorescent light method, in which the oxygen radical is excited by the light of the wavelength equal to that in the case of the absorption spectroscopy and the fluorescent light (having the same wavelength) thus emitted is measured so as to calculate the density of the oxygen radical.

Also, in the embodiment described above, the resist film 104 included in the structure shown in FIG. 2A is subjected to the ashing treatment. However, the plasma processing of the present invention can be employed widely for the removal of an organic material film such as a resist film or an organic low-k film forming an upper layer relative to a SiOCH series insulating film having a low dielectric constant. For example, the plasma processing of the present invention can be applied to the removal by etching of an organic low-k film constructed as shown in FIGS. 7A and 7B.

Figure 7A:
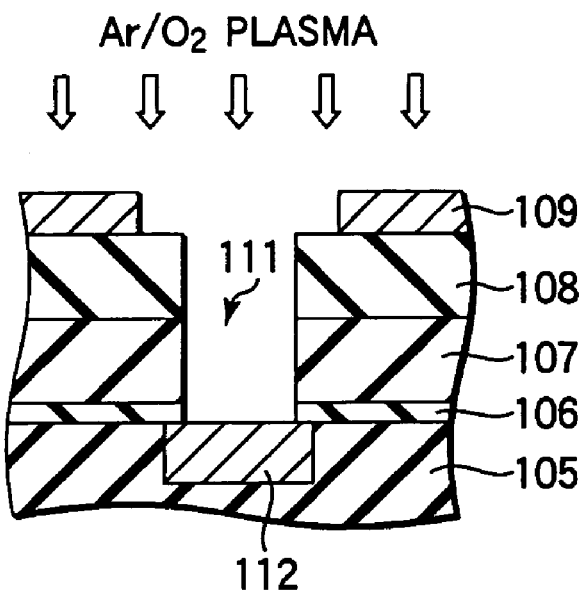
FIGS. 7A and 7B are cross sectional views schematically showing the construction of a gist portion of a wafer for explaining the application of the plasma processing method to the etching.
Figure 7B:
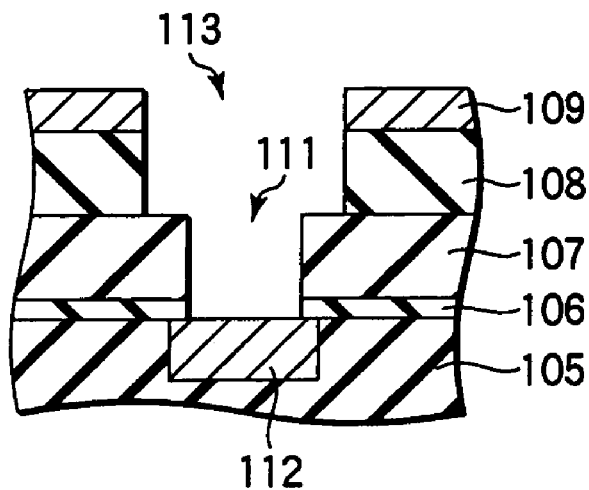

FIGS. 7A and 7B collectively show an etching process of an organic low-k film included in a dual damascene process. A reference numeral 105 shown in the drawing denotes an insulating film used as a lower wiring layer. As shown in the drawing, an SiC film 106, an MSQ film 107, which is a SiOCH series film, an organic low-k film 108, and a $SiO_2$ film 109 are laminated in the order mentioned on the insulating film 105. A lower wiring 112 consisting of a metallic material such as Cu is formed in the insulating film 105. The lower wiring 112 is exposed to a via hole 111. As shown in FIG. 7A, a plasma processing is applied to the organic low-k film 108 by using a plasma containing a rare gas such as Ar and an $O_2$ under the conditions described previously. The plasma processing is carried out by using the $SiO_2$ film 109 as a mask. As a result, the organic low-k film 108 is partly etched so as to form a groove 113 for the upper wiring layer as shown in FIG. 7B. The low-k film 108 that is to be etched is formed of, for example, a polyarylene series material such as SiLk (trade name, manufactured by Dow Chemical Inc.) and FLARE (trade name, manufactured by Honeywell Inc.).

What is claimed is:

1. A plasma processing method, comprising:
    setting a state in which a target object is placed directly below a plasma generation field defined in a process chamber, the target object comprising a patterned SiOCH series film and an organic material film forming an upper layer relative to the patterned SiOCH series film;
    generating a plasma of a process gas containing an $O_2$ gas in the plasma generation field such that the plasma has an $O_2^+$ ion density of $1\times10^{11}$ to $5\times10^{12}$ cm$^{-3}$, an oxygen radical density of $1\times10^{13}$ to $1\times10^{14}$ cm$^{-3}$, and a ratio of $O_2^+$ ion density relative to oxygen radical density set at 0.01 to 0.2; and
    performing a process of removing the organic material film by use of the plasma.

2. The plasma processing method according to claim 1, wherein the $O_2^+$ ion has an energy of 0.5 to 7 eV.

3. The plasma processing method according to claim 1, wherein the process pressure is set at 75 to 125 Pa.

4. The plasma processing method according to claim 1, wherein an intermediate layer is formed between the SiOCH series film and the organic material film.

5. The plasma processing method according to claim 1, wherein the organic material film is an etching mask made of a resist, and the process of removing the organic material film is an ashing process.

6. The plasma processing method according to claim 1, wherein the process of removing the organic material film by use of the plasma includes contacting the organic material film with the plasma.

7. The plasma processing method according to claim 1, wherein the process gas contains an inert gas.

8. The plasma processing method according to claim 7, wherein the inert gas is selected from the group consisting of Ar, Kr and Xe.

9. The plasma processing method according to claim 7, wherein the $O_2^+$ ion is formed by the charge transfer from the ion of the inert gas within the plasma.

10. The plasma processing method according to claim 1, wherein the plasma is a down flow plasma formed by a surface wave type plasma generating means.

11. The plasma processing method according to claim 10, wherein a microwave having a frequency of 500 MHz to 10 GHz is applied to the surface wave type plasma generating means.

12. The plasma processing method according to claim 11, wherein the power of the microwave per unit area is 2.0 to 5.0 W/cm$^2$.

13. A plasma processing method performed in a surface wave type plasma processing apparatus arranged to introduce a microwave from a slot antenna into a process chamber to propagate a surface wave and thereby generate plasma; the method comprising:

setting a state in which a target object is placed directly below a plasma generation field defined in the process chamber, the target object comprising a patterned SiOCH series film and, an organic material film forming an upper layer relative to the patterned SiOCH series film;

generating a plasma of a process gas containing an $O_2$ gas and an inert gas in the plasma generation field such that the plasma has an $O_2^+$ ion density of $1\times10^{11}$ to $5\times10^{12}$ cm$^{-3}$, an oxygen radical density of $1\times10^{13}$ to $1\times10^{14}$ cm$^{-3}$, and a ratio of $O_2^+$ ion density relative to oxygen radical density set at 0.01 to 0.2; by use of conditions such that the $O_2$ gas has a flow rate ratio of not higher than 3% in the process gas, the process chamber has an inner pressure of 75 to 125 Pa, and the microwave having has a frequency of 500 MHz to 10 GHz and is applied with a power per unit area of the microwave set at 2.0 to 5.0 W/cm$^2$; and performing a process of removing the organic material film by use of the plasma.

14. The plasma processing method according to claim 13, wherein an intermediate layer is formed between the SiOCH series film and the organic material film.

15. The plasma processing method according to claim 13, wherein the organic material film is an etching mask made of a resist, and the process of removing the organic material film is an ashing process.

16. The plasma processing method according to claim 13, wherein the process of removing the organic material film by use of the plasma includes contacting the organic material film with the plasma.

17. The plasma processing method according to claim 13, wherein the $O_2$ gas has a flow rate ratio of not lower than 0.1% in the process gas.

18. The plasma processing method according to claim 17, wherein the $O_2$ gas has a flow rate ratio of 0.1 to 1% in the process gas.

19. The plasma processing method according to claim 13, wherein the method comprises:

measuring a plasma parameter of the plasma with a measuring section to measure and monitor the plasma parameter while removing the organic material film.

20. The plasma processing method according to claim 19, wherein the plasma parameter includes the oxygen radical density, the ion density or the electron density in the plasma.

21. The plasma processing method according to claim 19, wherein the process conditions are controlled based on the values of the plasma parameters within the plasma that have been measured by the measuring section.

22. The plasma processing method according to claim 21, wherein the process conditions include at least one condition selected from the group consisting of the flow rate ratio of the $O_2$ gas contained in the process gas, the process pressure and the power of the microwave.

\* \* \* \* \*